United States Patent
Mizutani et al.

(10) Patent No.: US 10,403,491 B2
(45) Date of Patent: *Sep. 3, 2019

(54) METHOD FOR TREATING PATTERN STRUCTURE, METHOD FOR MANUFACTURING ELECTRONIC DEVICE, AND TREATMENT LIQUID FOR INHIBITING COLLAPSE OF PATTERN STRUCTURE

(71) Applicant: FUJIFILM Corporation, Tokyo (JP)

(72) Inventors: Atsushi Mizutani, Shizuoka (JP); Tadashi Inaba, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,778

(22) Filed: Dec. 27, 2017

(65) Prior Publication Data

US 2018/0122628 A1 May 3, 2018

Related U.S. Application Data

(63) Continuation of application No. PCT/JP2016/069663, filed on Jul. 1, 2016.

(30) Foreign Application Priority Data

Jul. 13, 2015 (JP) .................................. 2015-139598

(51) Int. Cl.
*H01L 21/02* (2006.01)
*B08B 3/08* (2006.01)
(Continued)

(52) U.S. Cl.
CPC ............ *H01L 21/0206* (2013.01); *B08B 3/08* (2013.01); *B81C 1/00952* (2013.01); *C08K 3/16* (2013.01);
(Continued)

(58) Field of Classification Search
None
See application file for complete search history.

(56) References Cited

U.S. PATENT DOCUMENTS 9,799,538 B2 10/2017 Kaneko et al.
2008/0125342 A1 5/2008 Visintin et al.
(Continued)

FOREIGN PATENT DOCUMENTS

JP 2003122027 4/2003
JP 2003213463 7/2003
(Continued)

OTHER PUBLICATIONS

"International Search Report (Form PCT/ISA/210) of PCT/JP2016/069663," dated Aug. 2, 2016, with English translation thereof, pp. 1-5.

(Continued)

*Primary Examiner* — Shamim Ahmed
(74) *Attorney, Agent, or Firm* — JCIPRNET

(57) ABSTRACT

Provided are a method for treating a pattern structure which is capable of inhibiting collapse of a pattern structure, a method for manufacturing an electronic device including such a treatment method, and a treatment liquid for inhibiting collapse of a pattern structure. The method for treating a pattern structure includes applying a treatment liquid containing a fluorine-based polymer having a repeating unit containing a fluorine atom to a pattern structure formed of an inorganic material.

25 Claims, 3 Drawing Sheets

(51) Int. Cl.
*C08K 3/16* (2006.01)
*C08K 5/17* (2006.01)
*B81C 1/00* (2006.01)

(52) U.S. Cl.
CPC .......... *C08K 5/17* (2013.01); *H01L 21/02057* (2013.01); *H01L 21/02071* (2013.01); *B81B 2203/0361* (2013.01); *B81B 2207/056* (2013.01)

(56) References Cited

U.S. PATENT DOCUMENTS

| | | | | |
|---|---|---|---|---|
| 2010/0143641 | A1* | 6/2010 | Yamamoto | D06M 11/05 428/96 |
| 2011/0174337 | A1 | 7/2011 | Nishimura et al. | |
| 2011/0214685 | A1* | 9/2011 | Kumon | B08B 3/00 134/1 |
| 2012/0205345 | A1* | 8/2012 | Ohto | H01L 21/02057 216/101 |
| 2012/0214722 | A1 | 8/2012 | Ohto et al. | |
| 2013/0165365 | A1* | 6/2013 | Matsunaga | B81C 1/00825 510/175 |
| 2014/0256155 | A1* | 9/2014 | Ting | G03F 7/423 438/778 |
| 2015/0323871 | A1* | 11/2015 | Klipp | C11D 1/835 510/176 |
| 2016/0254140 | A1* | 9/2016 | Saito | C07F 9/3808 134/22.19 |

FOREIGN PATENT DOCUMENTS

| | | |
|---|---|---|
| JP | 2007262262 | 10/2007 |
| JP | 2009029874 | 2/2009 |
| JP | 2010509777 | 3/2010 |
| JP | 2011151114 | 8/2011 |
| JP | 2014123704 | 7/2014 |
| WO | 2011049091 | 4/2011 |

OTHER PUBLICATIONS

"Written Opinion of the International Searching Authority (Form PCT/ISA/237) of PCT/JP2016/069663," dated Aug. 2, 2016, with English translation thereof, pp. 1-10.
"Office Action of Japan Counterpart Application," with machine English translation thereof, dated Sep. 25, 2018, p. 1-p. 6.
Office Action of Japan Counterpart Application, with English translation thereof, dated Dec. 25, 2018, pp. 1-6.
"Office Action of Korea Counterpart Application," with machine English translation thereof, dated Jul. 3, 2019, p. 1-p. 11.

* cited by examiner

METHOD FOR TREATING PATTERN STRUCTURE, METHOD FOR MANUFACTURING ELECTRONIC DEVICE, AND TREATMENT LIQUID FOR INHIBITING COLLAPSE OF PATTERN STRUCTURE

CROSS-REFERENCE TO RELATED APPLICATIONS

This application is a Continuation of PCT International Application No. PCT/JP2016/069663 filed on Jul. 1, 2016, which claims priority under 35 U.S.C. § 119(a) to Japanese Patent Application No. 2015-139598 filed on Jul. 13, 2015. The above application is hereby expressly incorporated by reference, in its entirety, into the present application.

BACKGROUND OF THE INVENTION

1. Field of the Invention

The present invention relates to a method for treating a pattern structure, a method for manufacturing an electronic device, and a treatment liquid for inhibiting collapse of a pattern structure.

2. Description of the Related Art

A fine pattern structure obtained by etching or the like has been conventionally used in the field of manufacturing an electronic device such as a semiconductor substrate product. As an electronic device becomes smaller or more highly integrated, the pattern structure has been increasingly miniaturized.

From the viewpoint of cleaning or the like, the pattern structure obtained by etching or the like is generally subjected to application of a chemical liquid. Thereafter, a rinsing treatment is carried out, and then drying is carried out. This drying leads to evaporation of the rinsing liquid or the like applied in the rinsing treatment.

Meanwhile, for example, in the case where a pattern structure is constituted by a plurality of columnar structures, there is a case where the columnar structures collapse so as to be pulled in due to the influence of the surface tension of the rinsing liquid or the like remaining in the separation portions between the columnar structures upon evaporation of the rinsing liquid or the like. As the pattern structure becomes finer, collapse thereof is more remarkable.

In recent years, a technique for inhibiting collapse of a pattern structure has been desired. For example, WO2011/049091A has proposed application of a specific treatment liquid to a pattern structure before a rinsing treatment.

SUMMARY OF THE INVENTION

The present inventors have examined the technique described in WO2011/049091A and therefore found that an effect of inhibiting collapse of a pattern structure may be insufficient in some cases depending on the type of rinsing liquids.

Accordingly, an object of the present invention is to provide a method for treating a pattern structure which is capable of inhibiting collapse of a pattern structure, a method for manufacturing an electronic device including such a treatment method, and a treatment liquid for inhibiting collapse of a pattern structure.

The foregoing object has been achieved by the following means.

[1] A method for treating a pattern structure, comprising applying a treatment liquid containing a fluorine-based polymer having a repeating unit containing a fluorine atom to the pattern structure formed of an inorganic material.

[2] The method for treating a pattern structure according to [1], in which the fluorine-based polymer includes a fluoroalkyl (meth)acrylate polymer.

[3] The method for treating a pattern structure according to [1] or [2], in which the fluorine-based polymer is cationic.

[4] The method for treating a pattern structure according to any one of [1] to [3], in which the treatment liquid includes water.

[5] The method for treating a pattern structure according to any one of [1] to [4], in which the pattern structure includes at least one selected from the group consisting of Si, $SiO_2$, SiN, Ge, and SiGe.

[6] The method for treating a pattern structure according to any one of [1] to [5], in which the pattern structure includes all of Si, $SiO_2$, and SiN.

[7] The method for treating a pattern structure according to any one of [1] to [6], in which the treatment liquid has a pH of 11 or less.

[8] The method for treating a pattern structure according to any one of [1] to [7], in which the treatment liquid has a pH of 4 or more and 11 or less.

[9] The method for treating a pattern structure according to any one of [1] to [8], in which the treatment liquid further contains a buffer.

[10] The method for treating a pattern structure according to any one of [1] to [9], in which a rinsing liquid containing an organic solvent is applied to the pattern structure to which the treatment liquid has been applied.

[11] A method for manufacturing an electronic device, comprising the method for treating a pattern structure according to any one of [1] to [10].

[12] A treatment liquid for inhibiting collapse of a pattern structure, comprising a fluorine-based polymer having a repeating unit containing a fluorine atom, in which the treatment liquid is applied to the pattern structure formed of an inorganic material.

[13] The treatment liquid for inhibiting collapse of a pattern structure according to [12], in which the fluorine-based polymer includes a fluoroalkyl (meth)acrylate polymer.

[14] The treatment liquid for inhibiting collapse of a pattern structure according to [12] or [13], in which the fluorine-based polymer is cationic.

[15] The treatment liquid for inhibiting collapse of a pattern structure according to any one of [12] to [14], further comprising water.

[16] The treatment liquid for inhibiting collapse of a pattern structure according to any one of [12] to [15], in which the pattern structure includes at least one selected from the group consisting of Si, $SiO_2$, SiN, Ge, and SiGe.

[17] The treatment liquid for inhibiting collapse of a pattern structure according to any one of [12] to [16], in which the pattern structure includes all of Si, $SiO_2$, and SiN.

[18] The treatment liquid for inhibiting collapse of a pattern structure according to any one of [12] to [17], in which the treatment liquid has a pH of 11 or less.

[19] The treatment liquid for inhibiting collapse of a pattern structure according to any one of [12] to [18], in which the treatment liquid has a pH of 4 or more and 11 or less.

[20] The treatment liquid for inhibiting collapse of a pattern structure according to any one of [12] to [19], further comprising a buffer.

According to the present invention, it is possible to provide a method for treating a pattern structure which is capable of inhibiting collapse of a pattern structure, a method for manufacturing an electronic device including such a treatment method, and a treatment liquid for inhibiting collapse of a pattern structure.

DESCRIPTION OF THE PREFERRED EMBODIMENTS

Figure 1A:
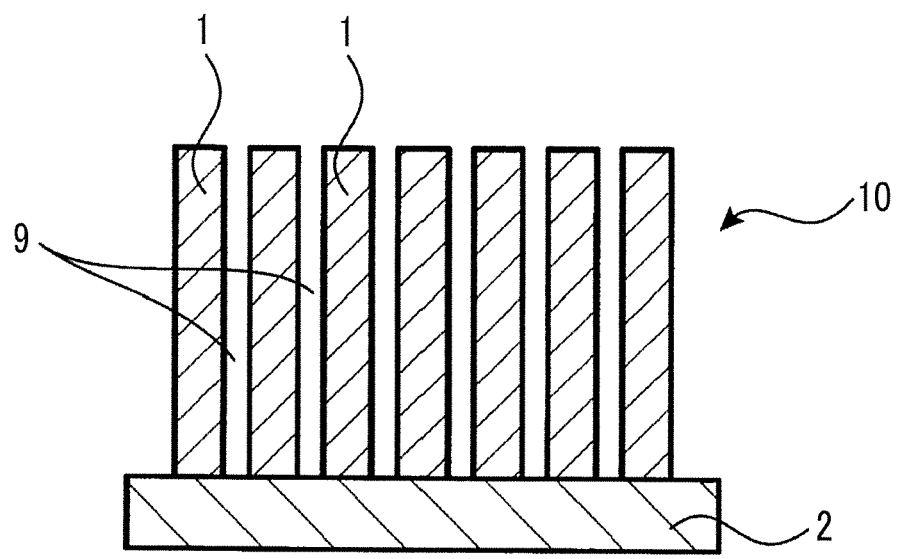
FIG. 1A is a cross-sectional view schematically showing a step of preparing a pattern structure of a preferred embodiment of a method for treating a pattern structure according to the present invention.

In the description of the present specification, in the case where a group (atomic group) is denoted without specifying whether substituted or unsubstituted, the group is intended to include both of a group having no substituent and a group having a substituent, within a range not impairing the effects of the present invention. For example, an "alkyl group" includes not only an alkyl group having no substituent (unsubstituted alkyl group) but also an alkyl group having a substituent (substituted alkyl group). The same shall apply to respective compounds.

The term "radiation" as used herein refers to, for example, a bright line spectrum of mercury lamp, far ultraviolet rays represented by excimer laser light, extreme ultraviolet rays (EUV light), X-rays, or electron beams. The term "light" as used herein refers to actinic rays or radiation. Unless otherwise indicated, the term "exposure" as used herein is intended to include not only exposure to a bright line spectrum of mercury lamp, far ultraviolet rays represented by excimer laser light, X-rays, EUV light, or the like but also lithography with particle beams such as electron beams and ion beams.

As used herein, the term "(meth)acrylate" refers to either or both of acrylate and methacrylate, and the term "(meth)acrylic" refers to either or both of acrylic and methacrylic.

The term "monomer" in the present specification is distinguished from an oligomer and a polymer, and unless otherwise specified, it refers to a compound having a weight-average molecular weight of 2,000 or less. As used herein, the term "polymerizable compound" refers to a compound having a polymerizable functional group, which may be a monomer or a polymer. The term "polymerizable functional group" refers to a group involved in the polymerization reaction.

Further, the term "preparation" as used herein is intended to include the provision of a specific material by synthesis or formulation thereof, but also the procurement of a predetermined material by purchase or the like.

[Method for Treating a Pattern Structure]

The method for treating a pattern structure according to the present invention (hereinafter, also simply referred to as a "treatment method according to the present invention") is a method for treating a pattern structure in which a treatment liquid containing a fluorine-based polymer having a repeating unit containing a fluorine atom is applied to a pattern structure formed of an inorganic material.

Hereinafter, for the purpose of convenience, the treatment liquid used in the present invention is also referred to as a "pretreatment liquid", and the application of such a "pretreatment liquid" to a pattern structure is also referred to as a "pretreatment".

In the case where the pattern structure is subjected to a pretreatment by using the pretreatment liquid described in, for example, WO2011/049091A, collapse of the pattern structure can be inhibited even when it is dried, as long as the pattern structure is rinsed with pure water or the like after the pretreatment.

Incidentally, in the case where an organic solvent (for example, isopropyl alcohol) or a mixed liquid of an organic solvent and water is used for the rinsing liquid or the pretreatment liquid, the surface tension of the liquid with respect to the pattern structure can be lowered, so that an organic solvent may be used for the rinsing liquid or the pretreatment liquid.

However, in the case where a rinsing liquid or pretreatment liquid containing an organic solvent is applied to a pattern structure which is then dried, the pattern structure may collapse in some cases. This is probably because components contained in the pretreatment liquid dissolve in the organic solvent in the rinsing liquid or the pretreatment liquid, thus making it difficult to obtain an effect of inhibiting collapse of a pattern structure.

On the other hand, the fluorine-based polymer having a repeating unit containing a fluorine atom contained in the pretreatment liquid according to the present invention is difficult to dissolve in the organic solvent contained in the rinsing liquid or the pretreatment liquid, and therefore it is considered that an effect of inhibiting collapse of a pattern structure can be sufficiently obtained even in the case of being dried after a pretreatment or a rinsing treatment.

Preferred Embodiment

FIGS. 1A to 1D are cross-sectional views schematically showing individual steps of a preferred embodiment of the method for treating a pattern structure according to the present invention. Although the flow of steps is shown in FIGS. 1A to 1D, other steps may be appropriately included before or after, or in the middle of each step, and it is also not hindered to change the order of steps as appropriate.

FIG. 1A shows a step of preparing a pattern structure. In FIG. 1A, a semiconductor substrate product (manufacturing intermediate) having a pattern structure 10 on a substrate 2 is shown. The pattern structure 10 according to the present embodiment is shown in a form in which a plurality of columnar structure portions 1 are arranged through a plurality of separation portions 9. In the present embodiment, the columnar structure portions 1 are also wall-like portions extending in the depth direction or the front direction in the drawing. Such columnar structure portions 1 are arranged at regular intervals to form the pattern structure 10 according to the present embodiment. The method for forming the pattern structure 10 is not particularly limited. As an example, there is a method in which a resist (resin) is applied onto each columnar structure portion 1, and the separation portion 9 is cut by dry etching using this as a mask. Thereafter, the remaining resist and residues are removed by ashing or the like, whereby a desired pattern structure 10 can be obtained. Then, the obtained pattern structure 10 is appropriately immersed in a bath or the like filled with a predetermined chemical liquid, so that cleaning or the like is carried out.

The member width w2 of the columnar structure portion 1 and the separation width w1 of the separation portion 9 (both of which refer to FIG. 1D) are not particularly limited, and the width may be appropriately set according to the design of an element or the like. In the present embodiment, for the purpose of illustration, the member width w2 of the columnar structure portion 1 and the separation width w1 of the separation portion 9 are respectively set to be equal widths and equal intervals.

The term "pattern structure" as used herein refers to a structure including irregularities on the surface in accordance with a certain rule. Typically, the pattern structure may be, for example, a structure formed by columnar structures erected in plural numbers through predetermined separation portions. Here, the columnar structure generally refers to a structure having a height, and includes not only a cylindrical and/or a prismatic structure, but also a wall-shaped structure and/or a chevron-shaped structure erected in a planar shape. The columnar structure is preferably a pattern structure in which a plurality of columnar structures, prismatic structures, and wall-shaped structures are arranged, since the effects of the present invention become more remarkable. In the present invention, as will be described later, the pattern structure is formed of an inorganic material.

The member width w2 of the columnar structure portion 1 is preferably 1 nm or more, more preferably 5 nm or more, and still more preferably 10 nm or more. The upper limit of w2 is preferably 100 nm or less, more preferably 75 nm or less, and still more preferably 50 nm or less.

The separation width w1 of the separation portion 9 is preferably 1 nm or more, more preferably 5 nm or more, and still more preferably 10 nm or more. The upper limit of w1 is preferably 150 nm or less, more preferably 120 nm or less, and still more preferably 100 nm or less.

The depth h of the pattern (height of columnar structure portion 1) (refer to FIG. 1D) is preferably 10 nm or more, more preferably 20 nm or more, and still more preferably 30 nm or more. The upper limit of h is preferably 2,000 nm or less, more preferably 1,000 nm or less, and still more preferably 300 nm or less.

The aspect ratio (value obtained by dividing height h by member width w2) of the columnar structure portion 1 is preferably 1 or more, more preferably 10 or more, and still more preferably 20 or more. The upper limit of the aspect ratio is preferably 100 or less, more preferably 50 or less, and still more preferably 30 or less.

It is preferred that the member width w2 is smaller and the separation width w1 is smaller since the effects of the present invention are significantly exhibited. The aspect ratio is preferably larger since the effects of the present invention are significantly exhibited.

The measurement position of the member width w2 and the separation width w1 may be appropriately set, but such a width typically refers to the width measured at the middle position of the height h of the columnar structure portion 1. For example, in the case where the columnar structure portion 1 and/or the separation portion 9 are rectangular in cross section, the length of the short side is taken as the respective width. In the case of an amorphous or elliptical shape or the like, the equivalent circle diameter may be set as its length (width).

Figure 1B:
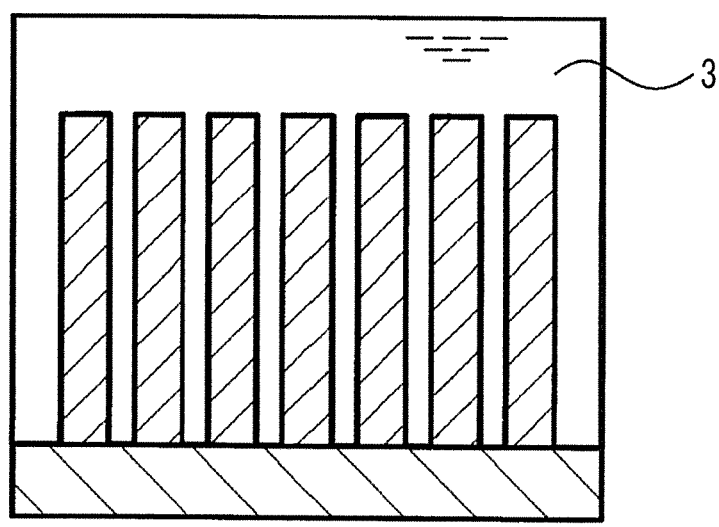
FIG. 1B is a cross-sectional view schematically showing a step of subjecting a pattern structure of a preferred embodiment of a method for treating a pattern structure according to the present invention to a pretreatment.

FIG. 1B shows a step of subjecting a pattern structure to a pretreatment. This step is a step which becomes a main part of the present embodiment and is a step of treating a pattern structure 10 using a pretreatment liquid 3. This pretreatment liquid 3 will be separately described in detail, and in the present embodiment, the pretreatment liquid 3 contains a fluorine-based polymer having a repeating unit containing a fluorine atom. By applying the pretreatment liquid 3, the collapse of the pattern structure 10 can be effectively inhibited or prevented in the case where a treatment is subsequently carried out using a rinsing liquid 4. Here, the "collapse" is not to be construed restrictively and indicates that the pattern structure 10 is destroyed locally or entirely. Typically, the collapse means that the pattern structure 10 is bent locally or entirely, and therefore the columnar structure portions 1 fall down.

Figure 1C:
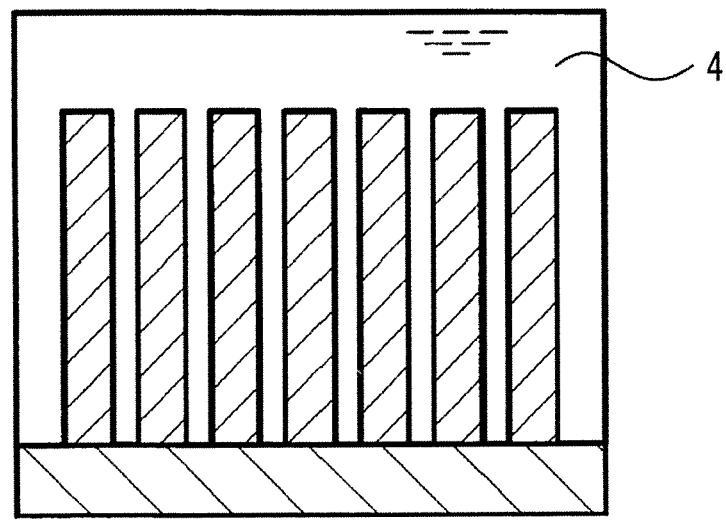
FIG. 1C is a cross-sectional view schematically showing a step of subjecting a pattern structure of a preferred embodiment of a method for treating a pattern structure according to the present invention to a rinsing treatment.

FIG. 1C shows a step of subjecting a pattern structure to a rinsing treatment. In this step, the pattern structure 10 is immersed in a bath filled with the rinsing liquid 4. Thereby, the rinsing liquid 4 can uniformly reach the wall surfaces of the columnar structure portions 1 forming the pattern structure 10 and/or the bottom portions of the separation portions 9. The rinsing step may also be additionally carried out before the pretreatment step. That is, a plurality of rinsing steps may be carried out with the pretreatment step being interposed therebetween.

Figure 1D:
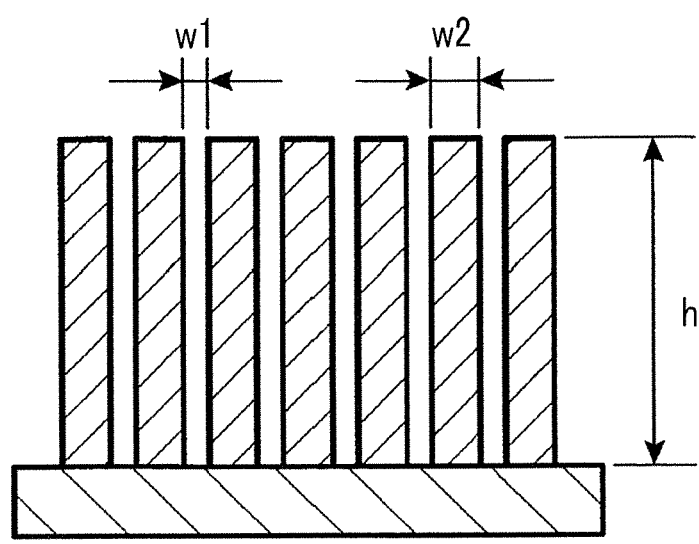
FIG. 1D is a cross-sectional view schematically showing a step of drying a pattern structure of a preferred embodiment of a method for treating a pattern structure according to the present invention.

FIG. 1D shows a step of drying a pattern structure. Here, it is possible to evaporate and remove the previously applied rinsing liquid 4 remaining in the pattern structure 10. The drying step is preferably carried out by heating, and the temperature of the environment atmosphere is preferably 15° C. or higher and 30° C. or lower. There is no particular restriction on the atmosphere at the time of drying, but, for example, the drying may be carried out in $N_2$ gas. In this drying step, it is preferred to evaporate a liquid (such as rinsing liquid 4) remaining in the separation portion 9 of the columnar structure portion 1 and remove the liquid from such a portion.

Figure 2:
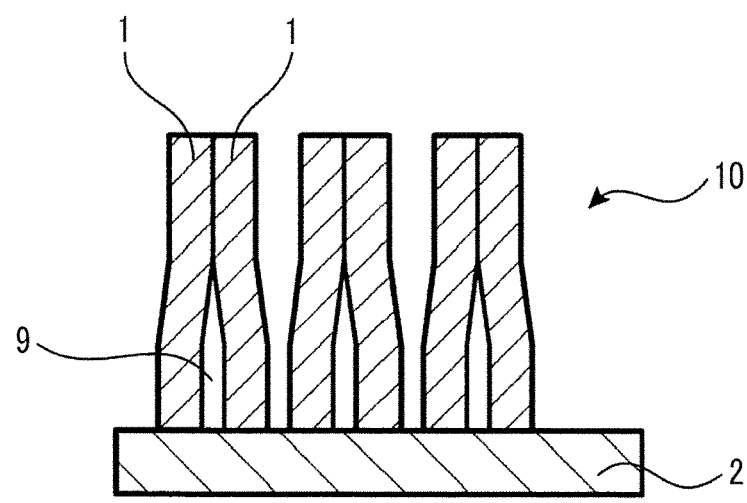
FIG. 2 is a cross-sectional view schematically showing an example of a collapsed pattern structure.

FIG. 2 is a cross-sectional view schematically showing an example of a collapsed pattern structure. In FIG. 2, the step corresponding to FIG. 1D is shown as an example where collapse has occurred, and is an example where the rinsing treatment is carried out without using the pretreatment liquid 3. Then, under the action of the surface tension of the liquid remaining in the separation portion 9 during the evaporation process, columnar structure portions 1 are collapsed so as to be pulled in due to the capillary force. As a result, the pattern structure 10 is collapsed, which shows an example in which the heads of two adjacent columnar structure portions 1 are collapsed so as to be brought into close contact with each other. As a form of collapse in the case of being collapsed by the surface tension of the rinsing liquid, the form as shown is a typical example.

For examples of formation and collapse of pattern structures, reference can be made to JP2013-519217A, WO2011/049091A, and the like.

Figure 3:
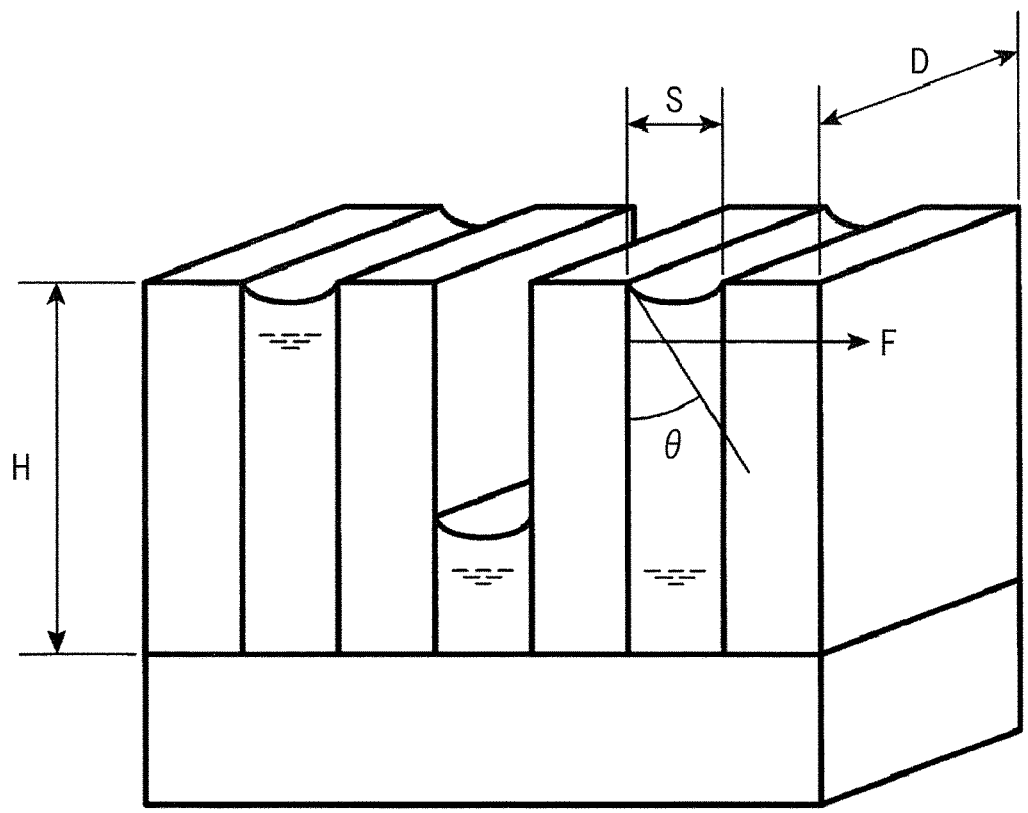
FIG. 3 is a schematic diagram for explaining the meaning of individual parameters applied to calculation of capillary force.

According to the findings of the present inventors, it has been found that it is possible to alleviate the above-described influence of the rinsing liquid by lowering the surface tension of the liquid with respect to the pattern structure, so the collapse of the pattern structure can be inhibited or prevented. Therefore, it is possible to prevent collapse of the pattern structure during the rinsing treatment and drying thereof, by reducing the surface tension of the liquid with respect to the pattern structure. According to the pretreatment liquid of the present invention, the surface tension of the pretreatment liquid can be reduced, so that collapse of the pattern structure can be effectively inhibited. This surface tension can be calculated by measuring the contact angle of the rinsing liquid according to the following expression (I). The meaning of each parameter can be understood by referring to FIG. 3. FIG. 3 is a schematic diagram for explaining the meaning of each parameter applied to the calculation of the capillary force.

$$F = 2\gamma D \times (\cos\theta_{CA} + \theta_t) \times H/S \qquad (I)$$

F: Capillary force
γ: Surface tension
D: Depth length of pattern
S: Separation width w1 of pattern
$\theta_{CA}$: Contact angle of pattern structure surface
$\theta_t$: Pattern taper angle
H: Pattern height In the present invention, it is important to be able to evaluate the ease of collapse (capillary force) by deriving the relational expression as described above and measuring the surface contact angle of the pattern structure. By applying the pretreatment liquid according to the preferred embodiment of the present invention, it is possible to increase the contact angle of the rinsing liquid, reduce the capillary force, and therefore reduce the risk of collapse of the pattern structure.

[Treatment Liquid (Pretreatment Liquid, Treatment Liquid for Inhibiting Collapse of Pattern Structure)]

Next, the treatment liquid (pretreatment liquid) used in the treatment method of the present invention will be described in detail. The pretreatment liquid of the present invention is a treatment liquid containing a fluorine-based polymer having a repeating unit containing a fluorine atom and is sometimes referred to as a treatment liquid for inhibiting collapse of a pattern structure.

Hereinafter, components contained in the pretreatment liquid according to the present invention will be described.

<Fluorine-Based Polymer having Repeating Unit Containing Fluorine Atom>

The fluorine-based polymer having a repeating unit containing a fluorine atom used in the present invention is a polymer which is formed by polymerizing a large number of monomers serving as repeating units and which contains fluorine atoms in the repeating units (monomers).

The form of the fluorine atom contained in the repeating unit of the fluorine-based polymer is not particularly limited, but it may be, for example, a fluoroalkyl group in which a part or all of the hydrogen atoms in the alkyl group are substituted with fluorine atoms, or a fluoroalkylene group in which a part or all of the hydrogen atoms in the alkylene group are substituted with fluorine atoms. In this case, the alkyl group and the alkylene group may be linear or branched, and the number of carbon atoms therein is also not particularly limited and is, for example, 1 to 20.

(Fluoroalkyl (meth)acrylate Polymer)

Such a fluorine-based polymer preferably includes, as an example, a fluoroalkyl (meth)acrylate polymer having a fluoroalkyl group.

Here, the fluoroalkyl group (hereinafter, also referred to as an $R^f$ group) is preferably a group in which two or more hydrogen atoms in the alkyl group are substituted with fluorine atoms. In the present invention, the alkyl group of the $R^f$ group also includes an oxaalkyl group having an ether bond between carbon-carbon bonds.

The $R^f$ group may contain halogen atoms other than fluorine atoms. Further, the $R^f$ group is preferably a group in which all of the hydrogen atoms in the alkyl group are substituted with fluorine atoms (that is, a perfluoroalkyl group).

The number of carbon atoms in the $R^f$ group is preferably 4 to 20 and more preferably 6 to 16. Further, the $R^f$ group may be linear or branched and is preferably linear.

Examples of the $R^f$ group include, but are not limited to, the following specific examples. Incidentally, the following examples include "structural isomeric groups" which are groups having the same molecular formula and a different structure.

Perfluoroalkyl groups such as $C_4F_9$—[$F(CF_2)_4$—$(CF_3)_2$CFCF$_2$—, $(CF_3)_3$C—, or the like], $C_5F_{11}$—[$F(CF_2)_5$—, $(CF_3)_3$CCF$_2$—, or the like], $C_6F_{13}$—, $C_7F_{15}$—, $C_8F_{17}$—, $C_9F_{19}$—, $C_{10}F_{21}$—, $C_{11}F_{23}$—, $C_{12}F_{25}$—, $C_{13}F_{27}$—, $C_{14}F_{29}$—, $C_{15}F_{31}$—, and $C_{16}F_{33}$—; fluoroalkyl groups such as $HC_tF_{2t}$— (where t is an integer of 4 to 20) and $Cl(CF_2)_8$—; oxafluoroalkyl groups such as $F(CF_2)_3OCF(CF_3)$—, $F(CF_2)_2[CF_2OCF(CF_3)]_2$—, $F(CF_2)_2[CF_2OCF(CF_3)]_3$—, $F(CF_2)_3$ $OCF(CF_3)O(CF_2)_2$—, $F(CF_2)_2[CF_2OCF(CF_3)]_2O(CF_2)_2$—, $F(CF_2)_5$ $OCF(CF_3)$—, $F[CF(CF_3)CF_2O]_x$ $CF(CF_3)(CF_2)_2$—, $F[CF(CF_3)CF_2O]_yCF(CF_3)$—, $F[CF(CF_3)CF_2O]_u$—, $F(CF_2CF_2CF_2O)_v(CF_2)_2$—, and $F(CF_2CF_2O)_w(CF_2)_2$— (where x and y are each an integer of 1 to 6, u is an integer of 1 to 6, v is an integer of 1 to 6, and w is an integer of 1 to 9); and the like.

In the present invention, the fluoroalkyl (meth)acrylate polymer is not particularly limited as long as it contains a repeating unit derived from a fluoroalkyl (meth)acrylate monomer. Here, the fluoroalkyl (meth)acrylate monomer refers to a compound in which the $R^f$ group is present in the ester residue of the (meth)acrylate. Incidentally, acrylate and methacrylate are collectively referred to as (meth)acrylate.

The fluoroalkyl (meth)acrylate monomer is preferably a compound represented by General Formula 1.

$R^f$-$Q^1$-OCOCR$^3$=CH$_2$  General Formula 1

In the formula, $Q^1$ represents a divalent organic group, $R^3$ represents a hydrogen atom or a methyl group, and $R^f$ has the same definition as the above-mentioned $R^f$ group. Specific examples of $Q^1$ include —$(CH_2)_{n+p}$—, —$(CH_2)_n$COONH$(CH_2)_p$—, —$(CH_2)_n$CONH$(CH_2)_p$—, —$(CH_2)_n$SO$_2$NH$(CH_2)_p$—, and —$(CH_2)_n$NHCONH$(CH_2)_p$— (where n and p are each 0 or an integer of 1 or more, and n+p represents an integer of 2 to 22). $Q^1$ is preferably —$(CH_2)_{n+p}$—, —$(CH_2)_n$CONH$(CH_2)_p$—, or —$(CH_2)_n$SO$_2$NH$(CH_2)_p$— (where p represents an integer of 2 or more, and n+p represents an integer of 2 to 6), and particularly preferably —$(CH_2)_{n+p}$—, or a case where n+p in —$(CH_2)_{n+p}$— is 2 to 6, that is, a dimethylene group, a trimethylene group, a tetramethylene group, a pentamethylene group, or a hexamethylene group.

Examples of the fluoroalkyl (meth)acrylate monomer represented by General Formula 1 include, but are not limited to, $CF_3(CF_2)_7(CH_2)_2OCOCR^3$=$CH_2$, $CF_3(CF_2)_7(CH_2)_3OCOCR^3$=$CH_2$, $CF_3(CF_2)_9(CH_2)_2OCOCR^3$=$CH_2$, $(CF_3)_2CF(CF_2)_6(CH_2)_2OCOCR^3=CH_2$, $F(CF_2)_m(CH_2)_2OCOCH=CH_2$ (mixture of m=6 to 16), $CF_2Cl(CF_2)_9(CH_2)_3OCOCR^3=CH_2$, $HCF_2(CF_2)_9(CH_2)_2OCOCR^3=CH_2$, $CF_3(CF_2)_9(CH_2)_{11}OCOCR^3=CH_2$, $CF_3(CF_2)_9CONH(CH_2)_5OCOCR^3=CH_2$, $CF_3(CF_2)_7SO_2N(C_3H_7)C_2H_4OCOCR^3=CH_2$, $CF_3(CF_2)_9O(CH_2)_2(CH_2)_2OCOCR^3=CH_2$, $CF_3(CF_2)_9CH_2OCOCR^3=CH_2$, $CF_3(CF_2)_9(CH_2)_3OCOCR^3=CH_2$, $CF_3(CF_2)_7CH_2CF_2(CH_2)_2OCOCR^3=CH_2$, $CF_3(CF_2)_7(CH_2)_4OCOCR^3=CH_2$, $CF_3(CF_2)_{13}(CH_2)_6OCOCR^3=CH_2$, and $CF_3(CF_2)_7(CH_2)_2OCH_2\text{-Ph-}(CH_2)_2OCOCR^3=CH_2$ (where Ph is a phenyl group).

In the fluoroalkyl (meth)acrylate polymer, the content ratio of the repeating unit derived from a fluoroalkyl (meth)acrylate monomer is preferably 5 mass % or more, more preferably 20 mass % or more, and still more preferably 40 mass % or more. The upper limit of the content of the repeating unit is 100 mass %.

Specifically, the fluoroalkyl (meth)acrylate polymer may be a homopolymer of a fluoroalkyl (meth)acrylate monomer or may be a copolymer of two or more fluoroalkyl (meth)acrylate monomers.

In the case where the fluoroalkyl (meth)acrylate polymer contains two or more repeating units derived from a fluoroalkyl (meth)acrylate monomer, preferred is an embodiment which contains repeating units derived from fluoroalkyl (meth)acrylate monomers in which the number of carbon atoms in the $R^f$ group is different therebetween.

Further, the fluoroalkyl (meth)acrylate polymer may be a copolymer of a fluoroalkyl (meth)acrylate monomer and another polymerizable compound.

Among them, the fluoroalkyl (meth)acrylate polymer is preferably a copolymer containing a repeating unit derived from a non-fluorine-based polymerizable compound as another polymerizable compound. The repeating unit derived from the non-fluorine-based polymerizable compound may be used alone or in combination of two or more thereof. Here, the non-fluorine-based polymerizable compound refers to a polymerizable compound not containing a fluorine atom.

The non-fluorine-based polymerizable compound may have or may not have a reactive group other than a polymerizable group.

Examples of the non-fluorine-based polymerizable compound having a reactive group include, but are not limited to, hydroxy group-containing (meth)acrylates such as 3-chloro-2-hydroxypropyl (meth)acrylate, 2-hydroxyethyl (meth)acrylate, 2-hydroxypropyl (meth)acrylate, diethylene glycol mono(meth)acrylate, polypropylene glycol mono(meth)acrylate, poly(oxyethylene/oxypropylene) glycol mono (meth)acrylate, glycerine mono(meth)acrylate, and trimethylolpropane mono(meth)acrylate; amides such as (meth)acrylamide, N-methylol (meth)acrylamide, diacetone (meth)acrylamide, N,N-dimethyl (meth)acrylamide, N,N-diethyl (meth)acrylamide, N,N-diisopropyl (meth)acrylamide, and N-butoxymethyl (meth)acrylamide; γ-trimethoxysilylpropyl (meth)acrylate; glycidyl (meth)acrylate; aziridinyl (meth)acrylate; and blocked isocyanate group-containing (meth)acrylate.

Examples of the non-fluorine-based polymerizable compound having no reactive group include, but are not limited to, (meth)acrylates such as behenyl (meth)acrylate, octadecyl (meth)acrylate, stearyl (meth)acrylate, cetyl (meth)acrylate, dodecyl (meth)acrylate, decyl (meth)acrylate, butyl (meth)acrylate, polyoxyalkylene (meth)acrylate, benzyl (meth)acrylate, cyclohexyl (meth)acrylate, 2-ethylhexyl (meth)acrylate, (meth)acrylate having a polysiloxane group, cyclododecyl (meth)acrylate, isobornyl (meth)acrylate, phenyl (meth)acrylate, benzyl (meth)acrylate, adamantyl (meth)acrylate, tolyl (meth)acrylate, 3,3-dimethylbutyl (meth)acrylate, 3,3-dimethyl-2-butyl (meth)acrylate, and dicyclopentyl (meth)acrylate; and vinyl chloride.

Further, the fluoroalkyl (meth)acrylate polymer preferably has a repeating unit derived from a polymerizable compound having a hydrophilic group (that is, a repeating unit having a hydrophilic group).

The non-fluorine-based polymerizable compound having a hydrophilic group may be suitably, for example, a polymerizable compound having an oxyalkylene group such as an oxyethylene group, in addition to the above-mentioned hydroxy group-containing (meth)acrylate such as 2-hydroxyethyl (meth)acrylate.

Further, the fluoroalkyl (meth)acrylate polymer may have a repeating unit derived from a polymerizable compound having a cationic group or an anionic group (that is, a repeating unit having a cationic group or an anionic group). Examples of the cationic group include a primary to tertiary amino group, an imino group, a quaternary ammonium base, and a hydrazine group. Examples of the anionic group include a carboxy group, a sulfo group, a phosphono group, and a base thereof.

In this way, properties such as cationic or anionic properties are imparted to the fluoroalkyl (meth)acrylate polymer.

The fluoroalkyl (meth)acrylate polymer may be a random copolymer or a block copolymer.

The fluoroalkyl (meth)acrylate polymer is preferably obtained in the form of an emulsion by emulsion polymerization or dispersion polymerization of the above-mentioned polymerizable compound containing a fluoroalkyl (meth)acrylate monomer. Specifically, a method in which the polymerizable compound is polymerized by adding a polymerization initiator in the presence of an emulsifier and a polymerization solvent can be mentioned. As the emulsifier, one or more non-ionic, cationic, anionic, amphoteric surfactants known or well known as emulsifiers can be adopted.

The emulsifier (surfactant) is not particularly limited, and examples thereof include (polyoxyalkylene) alkylamine, (polyoxyalkylene) alkenylamine, polyoxyethylene alkyl phenyl ether, N-substituted diamine, and polyoxyalkylene alkyl ether. The amount of the emulsifier is, for example, 0.5 to 20 parts by mass with respect to 100 parts by mass of the polymerizable compound.

Even in this case, the fluoroalkyl (meth)acrylate polymer is imparted with properties such as cationic or anionic properties.

The polymerization solvent for the polymerization is preferably an aqueous medium. The aqueous medium may contain an organic solvent. The organic solvent may be, for example, a water-soluble organic solvent, suitable examples of which include a ketone-based organic solvent such as acetone; and a glycol-based organic solvent such as diethylene glycol or dipropylene glycol.

The polymerization initiator is not particularly limited, and a general-purpose initiator such as a peroxide-based initiator, for example an organic peroxide, an azo-based initiator, a redox-based initiator, or a persulfate can be used according to the polymerization temperature. In addition, the polymerization may be initiated by ionizing radiation or the like. In the polymerization reaction, a chain transfer agent such as mercaptans may be present in the polymerization reaction system.

The polymer synthesized by the above polymerization is preferably present as fine particles in a polymerization solvent.

The particle diameter of the fine particles is preferably 0.01 to 1 μm and more preferably 0.05 to 0.5 μm. The particle diameter can be measured by a dynamic light scattering device, an electron microscope, or the like.

(Weight-Average Molecular Weight of Fluorine-Based polymer)

The weight-average molecular weight (Mw) of the fluorine-based polymer used in the present invention is not particularly limited, but it is preferably 1,000 to 100,000 and more preferably 5,000 to 50,000.

In the case where the weight-average molecular weight of the fluorine-based polymer used in the present invention is 1,000 or more, the polymer tends to adhere to a pattern structure, so that the effects of the present invention are more easily exerted. On the other hand, in the case where the weight-average molecular weight of the fluorine-based polymer is 100,000 or less, it is easy to obtain sufficient solubility in a pretreatment liquid.

The weight-average molecular weight and the number-average molecular weight are polystyrene equivalent values determined by gel permeation chromatography (GPC) using tetrahydrofuran (THF) as a developing solvent. More specifically, measurement of the molecular weight is carried out using GPC under the following conditions.

Apparatus: HLC-8320 GPC manufactured by Tosoh Corporation

Column: TSK-GEL G3000PWXL manufactured by Tosoh Corporation

Column temperature: 35° C.

Flow rate: 0.5 mL/min

Calibration curve: POLY SODIUM ACRYLATE STANDARD manufactured by Sowa Kagaku Co., Ltd.

Eluent: A solution prepared by diluting a mixture of sodium dihydrogen phosphate dodecahydrate/disodium hydrogen phosphate dihydrate (34.5 g/46.2 g) with 5,000 g of pure water.

(Cationic Properties or the Like of Fluorine-Based Polymer)

The fluorine-based polymer used in the present invention can be imparted with properties such as cationic or anionic properties, among which preferred are cationic properties. In the case where the fluorine-based polymer is cationic, the polymer tends to adhere to a pattern structure and therefore the effects of the present invention are more easily exerted.

The method of imparting properties such as cationic properties to the fluorine-based polymer used in the present invention is not particularly limited, and for example, as described above, there is a method of carrying out polymerization using a polymerizable compound having a cationic group or the like, or a method of carrying out polymerization using a cationic emulsifier.

(Content of Fluorine-Based Polymer)

The content of the fluorine-based polymer in the pretreatment liquid used in the present invention is preferably 0.0001 mass % or more, more preferably 0.0005 mass % or more, and still more preferably 0.001 mass % or more. The upper limit of the content of the fluorine-based polymer is, for example, 10 mass % or less, preferably 5 mass % or less, and more preferably 3 mass % or less.

The fluorine-based polymer may be used alone or in combination of two or more thereof.

(Examples of Commercially Available Fluorine-Based Polymer Products)

As the above-mentioned fluorine-based polymer having a repeating unit containing a fluorine atom, a commercially available product may be used, and specifically, for example, the following examples are preferable. Incidentally, "SURFLON S-221 (perfluoroalkyl trialkyl ammonium halide manufactured by AGC Seimi Chemical Co., Ltd.)" and the like, which have been used in WO2011/049091A, are not applicable to fluorine-based polymers having a repeating unit containing a fluorine atom.

<<Products Manufactured By Asahi Glass Company>>
ASAHI GUARD AG-E060 (cationic)
ASAHI GUARD AG-E100 (cationic)
ASAHI GUARD AG-E070 (cationic)
ASAHI GUARD AG-E080 (anionic)
ASAHI GUARD AG-E550D (non-ionic)
ASAHI GUARD AG-E600 (amphoteric)

<<Products Manufactured By AGC Seimi Chemical Co., Ltd.>>
SW-930
SWK-601

<<Products Manufactured By Nicca Chemical Co., Ltd.>>
NK GUARD SR-2020 (cationic)
NK GUARD S-0545 (non-ionic)
NK GUARD S-750 (cationic)

<<Products Manufactured By Daikin Industries, Ltd.>>
UNIDYNE TG-8111
UNIDYNE TG-6501

<<Product Manufactured By Fluoro Technology Co., Ltd.>>
FLUOROSURF FS-2050-P2.0 (non-ionic)

<<Product Manufactured By DIC Corporation>>
MEGAFACE F-570 (non-ionic)

<Water>

The pretreatment liquid of the present invention is preferably an aqueous treatment liquid containing water. The water is, for example, preferably water subjected to a purification treatment such as distilled water, ion exchanged water, or ultrapure water, and more preferably ultrapure water used for semiconductor production.

The amount of water is preferably 70 mass % or more, more preferably 80 mass % or more, and still more preferably 90 mass % or more in the pretreatment liquid. The upper limit of the amount of water is, for example, less than 100 mass % in consideration of addition of each component.

<pH>

The pH (hydrogen ion concentration) of the pretreatment liquid of the present invention is preferably 4 or more. In the case where the fluorine-based polymer contained in the pretreatment liquid is, for example, cationic, the effect is more easily exerted in the case where the pH of the pretreatment liquid is 4 or more.

On the other hand, in the case where the pH of the pretreatment liquid is too high, there is a possibility that the pattern structure to which the pretreatment liquid is applied may dissolve and be damaged, and therefore, the pH of the pretreatment liquid is preferably 11 or less.

The pH is a value measured using F-51 (trade name, manufactured by HORIBA, Ltd.) at room temperature (25° C.).

In addition, a conventionally known inorganic acid, organic acid, inorganic base, or organic base can be used for pH adjustment. The inorganic acid may be, for example, hydrochloric acid (HCl).

Examples of the inorganic base include salts of alkali metals (for example, KOH, LiOH, and NaOH), salts of alkaline earth metals (for example, $Ca(OH)_2$ and $Mg(OH)_2$), ammonium hydroxide or salts thereof; hydrazines or salts thereof; and hydroxylamine or salts thereof.

Suitable examples of the organic base include 2-aminoethanol (MEA), diglycol amine (2-(2-aminoethoxy)ethanol) (DGA), benzylamine (BzA), N,N-dimethyl-2-aminoethanol (DMEA), and 2-methylaminoethanol (MAE).

The content of the component used for pH adjustment is not particularly limited, and is preferably 0.005 mass % or more and more preferably 0.01 mass % or more in the pretreatment liquid. The upper limit of the content of the component used for pH adjustment is, for example, 3 mass % or less and preferably 1 mass % or less.

<Buffer>

The pretreatment liquid of the present invention preferably further contains a buffer (pH buffer), and more preferably contains a buffer having a pKa of 4 or more and 12 or less. As a result, the pH of the pretreatment liquid is unlikely to fluctuate, and therefore the storage stability is excellent.

The "pH buffer" is a compound which, in the case where it is added to a solution, is capable of preventing the hydrogen ion concentration of the solution from changing even by adding an acid or an alkali.

The "pKa" is one of the indicators for quantitatively expressing an acid strength, and is synonymous with an acidity constant. Considering dissociation reaction in which hydrogen ions are released from an acid, the equilibrium constant Ka is represented by its negative common logarithm pKa. A smaller pKa indicates a stronger acid. For example, a value calculated using ACD/Labs (manufactured by Advanced Chemistry Development Co., Ltd.) or the like may be used.

Examples of such a buffer include an inorganic acid, an organic acid, an inorganic base, and an organic base used for pH adjustment described hereinbefore. In addition, malic acid, glycolic acid, lactic acid, citric acid, phosphoric acid, formic acid, acetic acid, and the like are also preferably mentioned.

The content of the buffer is not particularly limited and is preferably 0.005 mass % or more and more preferably 0.01 mass % or more in the pretreatment liquid. The upper limit of the content of the buffer is, for example, 3 mass % or less and preferably 1 mass % or less.

<Organic Solvent>

The pretreatment liquid of the present invention may contain an organic solvent.

Examples of the organic solvent include alcohol compound solvents such as methanol, ethanol, 1-propanol, 2-propanol, 1-butanol, 2-butanol, ethylene glycol, propylene glycol, glycerin, 1,6-hexanediol, cyclohexane diol, sorbitol, xylitol, 2-methyl-2,4-pentanediol, 1,3-butanediol, and 1,4-butanediol; ether compound solvents including alkylene glycol alkyl ethers (ethylene glycol monomethyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, diethylene glycol monobutyl ether, and the like); amide compound solvents such as formamide, monomethylfonnamide, dimethylformamide, acetamide, monomethylacetamide, dimethylacetamide, monoethylacetamide, diethylacetamide, and N-methylpyrrolidone; sulfur-containing compound solvents such as dimethyl sulfone, dimethyl sulfoxide, and sulfolane; and lactone compound solvents such as γ-butyrolactone and δ-valerolactone.

Among these organic solvents, a water-miscible organic solvent is preferable, and a water-miscible organic solvent having a surface tension of 30 mN/m or less is more preferable. Specific examples of such organic solvents preferably include alkanols such as ethanol, 1-propanol, 2-propanol (isopropyl alcohol (IPA)), and 1-butanol, among which 2-propanol is more preferable. By using such a pretreatment liquid containing an organic solvent, collapse of the pattern structure can be further inhibited in the case where drying is carried out after the pretreatment or after the rinsing treatment.

The content of the organic solvent is preferably 0.1 to 80 mass %, more preferably 1.0 to 70 mass %, and still more preferably 5.0 to 60 mass % in the pretreatment liquid. Two or more organic solvents may be mixed, and the ratio therebetween is arbitrary.

In the case where the content of the organic solvent is within the above-specified range, the effect is sufficiently obtained, but in the case where the content of the organic solvent is 0.1 mass % or more, the effects of the present invention are more easily exerted. In the case where the content of the organic solvent is 80 mass % or less, solubility of the fluorine-based polymer described hereinbefore or additives described hereinafter in the pretreatment liquid can be easily obtained.

<Other additives>

Other additives can be added appropriately alone or in combination thereof to the pretreatment liquid of the present invention. Examples of other additives include a corrosion inhibitor (paragraph [0132] of JP2014-232874A, paragraphs [0015] to [0022] of JP2014-185332A, and paragraphs [0030] to [0037] of JP2014-220300A), and a chelating agent (paragraph [0024] of JP2014-093407A and paragraph [0024] of JP2014-041260A).

Where appropriate, a surfactant may be included. There are various known kinds of surfactants which can be arbitrarily selected according to the necessity. The surfactant may be, for example, an ionic or non-ionic surfactant, and specific examples thereof include alkylsulfonic acids or alkylcarboxylic acids; fluorine-containing derivatives thereof, esters, ammonium salts; silicone-based surfactants; and surfactants containing ethylene oxide, propylene oxide, or the like in the structure thereof.

Further, for example, a phosphoric acid ester or a salt thereof described in JP2015-35458A; a fluorine-containing ammonium halide, a fluorine-containing betaine, or a fluorine-containing amine oxide described in WO2011/049091A or WO2012/032854A; an imidazolium halide, a pyridinium halide, or an ammonium halide described in WO2012/032856A; an alkyl pyridinium halide described in WO2012/032855A; or the like may also be used to such an extent that the effects of the present invention are not impaired.

Further, for example, the silylating agents described in JP2011-091349A, JP2010-103136A, and JP2011-049468A may also be used to such an extent that the effects of the present invention are not impaired.

The content of the above-mentioned additives is preferably 0.0001 mass % to 10 mass %, more preferably 0.005 mass % to 7 mass %, and still more preferably 0.015 mass % to 5 mass % in the pretreatment liquid of the present invention. In the case where the content of the additives is within the above-specified range, the effects of the present invention can be sufficiently obtained while exerting the effects of the additives.

<Method for Producing Pretreatment Liquid, and the Like>

The pretreatment liquid of the present invention can be obtained by appropriately mixing the respective components.

As described hereinafter, it is preferable to filter the obtained pretreatment liquid using a filter for the purpose of removing foreign materials or reducing defects.

<Kit and Concentrated Liquid>

The pretreatment liquid of the present invention may be constituted as a kit in which the raw materials thereof are divided into multiple parts. The kit may be, for example, an embodiment in which, as a first liquid, a liquid composition in which the above-mentioned fluorine-based polymer is contained in water is prepared, and, as a second liquid, a liquid composition in which other components is contained in water is prepared. As an example of the use thereof, preferred is an embodiment in which both liquids are mixed to prepare a pretreatment liquid, and after that, the liquid is applied to the above-mentioned pretreatment on a timely basis. An organic solvent or the like may be contained in either thereof. This avoids the deterioration of the liquid performance due to decomposition of the fluorine-based polymer whereby a desired action can be effectively exhibited. The content of each component in the first liquid and the second liquid can be appropriately set as the content after mixing, based on the above-mentioned contents.

Further, the pretreatment liquid may be prepared as a concentrated liquid. In this case, the concentrated liquid can be used by dilution thereof with water at the time of use.

(Container)

The pretreatment liquid of the present invention (irrespective of whether or not it is a kit) can be stored, transported, and used by charging into an arbitrary container as long as it does not cause a problem associated with corrosion or the like. In addition, for semiconductor applications, a container with a high degree of cleanness and little elution of impurities is preferable. Examples of usable containers include, but are not limited to, "CLEAN BOTTLE" series (manufactured by Aicello Chemical Co., Ltd.) and "PURE BOTTLE" (manufactured by Kodama Plastics Co., Ltd.). The container or the inner wall of the accommodating portion thereof is preferably formed of a resin different from one or more resins selected from the group consisting of a polyethylene resin, a polypropylene resin, and a polyethylene-polypropylene resin, or a metal subjected to a rust prevention or metal elution prevention treatment.

As the above-mentioned different resins, a fluorine-based resin (perfluororesin) can be particularly preferably used. In this manner, by using a container in which the inner wall of the accommodating portion is made of a fluorine-based resin, the occurrence of a problem associated with the elution of oligomers of ethylene and/or propylene can be inhibited as compared with the case of using a container in which the inner wall of the accommodating portion is made of a polyethylene resin, a polypropylene resin, or a polyethylene-polypropylene resin.

A specific example of such a container in which the inner wall of the accommodating portion is made of a fluorine-based resin may be, for example, a FluoroPurePFA composite drum manufactured by Entegris, Inc. In addition, containers described in JP1991-502677A (JP-H03-502677A), page 4 and the like, WO2004/016526A, page 3 and the like, and WO99/46309A, pages 9 and 16, and the like can also be used.

(Filtering)

The pretreatment liquid of the present invention is preferably filtered using a filter for the purpose of removing foreign materials or reducing defects. Any filter may be used without particular limitation as long as it is conventionally used for filtration or the like. For example, the filter may be a filter formed of a fluororesin such as polytetrafluoroethylene (PTFE), a polyamide-based resin such as nylon, a polyolefin resin such as polyethylene or polypropylene (PP) (including ones having a high density and an ultra-high molecular weight), or the like. Among these materials, preferred are polypropylene (including high-density polypropylene) and nylon. The pore size of the filter is suitably about 0.001 to 1.0 μm, preferably about 0.01 to 0.5 μm, and more preferably about 0.02 to 0.1 μm. By specifying the pore size of the filter to be within this range, it becomes possible to reliably remove fine foreign materials such as impurities or aggregates contained in the pretreatment liquid, while inhibiting filtration clogging.

In the case of filter being used, different filters may be used in combination. In that case, filtering using a first filter may be carried out only once or may be carried out two or more times. In a case of filtering two or more times by combining different filters, the pore size for the second or subsequent filtering is preferably made larger than or equal to that for the first filtering. In addition, first filters having a different pore size in the above-mentioned range may be used in combination. The pore size herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation.

As the second filter, it is possible to use a filter formed of the same material as that of the above-mentioned first filter. The pore size of the second filter is suitably about 0.01 to 1.0 μm and preferably about 0.1 to 0.5 μm. By setting the pore size of the second filter to this range, in the case where component particles are contained in the pretreatment liquid, it is possible to remove foreign materials incorporated in the pretreatment liquid while these component particles remain therein.

For example, filtering using the first filter is carried out with a mixed liquid containing a part of the components of the pretreatment liquid, and the remaining components are mixed with the filtered mixed liquid to prepare the pretreatment liquid which may be then subjected to second filtering.

<Metal Concentration>

In the pretreatment liquid of the present invention, it is preferred that the ion concentrations of the metals (metal elements of Na, K, Ca, Fe, Cu, Mg, Mn, Li, Al, Cr, Ni, and Zn) contained as impurities in the liquid are all 5 ppm or less (preferably 1 ppm). It is assumed that a higher-purity pretreatment liquid is required, in particular, in the production of state-of-the-art semiconductor elements, so that the metal concentration thereof is even lower than the order of ppm, that is, it is more preferably in the order of ppb and more preferably in the order of ppt (the above-mentioned concentrations are all on a mass basis).

The method for reducing the metal concentration may be, for example, a method of sufficiently carrying out distillation and/or filtration using an ion exchange resin in at least one step of a step of the raw materials used in the preparation of the pretreatment liquid and a step after preparing the pretreatment liquid.

Another method of reducing the metal concentration may be, for example, a method of using a container having less elution of impurities, as described in the section describing the container for accommodating the pretreatment liquid, as the "container" for accommodating the raw materials used in the preparation of the pretreatment liquid. A further method of reducing the metal concentration may be, for example, a method of lining the inner wall of a pipe with a fluorine-based resin, such that metal components are not eluted from the "pipe" or the like used at the time of preparing the pretreatment liquid.

(Impurities and Coarse Particles)

In view of the intended use of the pretreatment liquid of the present invention, it is preferred that impurities in the liquid, for example, metal components and the like are small. In particular, it is preferred that Na, K and Ca ion concentrations in the liquid are each in the range of 1 ppt to 1 ppm (on a mass basis).

In the pretreatment liquid, the number of coarse particles having an average particle diameter of 0.5 μm or more is preferably in the range of 100 particles/cm$^3$ or less and more preferably in the range of 50 particles/cm$^3$ or less.

[Pattern Structure]

The pattern structure to which the pretreatment liquid of the present invention is applied is not particularly limited as long as it is a pattern structure formed of an inorganic material. For example, the pattern structure may be a pattern structure provided on a substrate as a member separate from the substrate or may be a pattern structure in which a part of the substrate is processed so that the pattern structure is formed integrally with the substrate.

Here, the substrate may be, for example, a semiconductor substrate.

The semiconductor substrate is used to mean not only a silicon substrate (wafer) but also an entire substrate structure provided with a circuit structure thereon. The semiconductor substrate member or member refers to a member constituting the semiconductor substrate as defined above and may be made of one material or a plurality of materials. It should be noted that the processed semiconductor substrate may be distinguished and referred to as a semiconductor substrate product in some cases, and if necessary, further distinguishably, a chip or the like obtained by subjecting the processed semiconductor substrate to further processing is referred to as a semiconductor element or a semiconductor device. That is, in a broad sense, a semiconductor element (semiconductor device) belongs to the semiconductor substrate product. Further, a product on which the semiconductor element is mounted is referred to as a semiconductor product. Although the direction of the semiconductor substrate is not particularly limited, for the purpose of illustration, in the present specification, the side of the columnar structure portion 1 is defined as the upper side and the side of the substrate 2 is defined as the lower side. In the accompanying drawings, the structure of a semiconductor substrate or a member thereof is shown in a simplified manner, and it may be interpreted as a necessary form where appropriate.

The inorganic material constituting such a pattern structure may be, for example, an inorganic material containing at least one selected from the group consisting of Si, $SiO_2$, SiN, Ge, and SiGe, and is preferably an inorganic material containing at least one selected from the group consisting of Si, $SiO_2$, and SiN.

Further, the pattern structure may also be preferably, for example, a pattern structure containing all of Si, $SiO_2$, and SiN. Such a pattern structure may be, for example, a pattern structure in which the columnar structure portion (refer to FIGS. 1A to 1D) has a three-layered structure (an upper layer, a middle layer, and a lower layer) in the vertical direction, and each layer is formed of Si, $SiO_2$, or SiN (for example, the upper layer: Si, the middle layer: $SiO_2$, and the lower layer: SiN).

[Rinsing Treatment]

The treatment method of the present invention is preferably an embodiment of carrying out a rinsing treatment for applying a rinsing liquid containing an organic solvent to the pattern structure to which the pretreatment liquid has been applied.

Such an organic solvent is preferably a water-miscible organic solvent and more preferably a water-miscible organic solvent having a surface tension of 30 mN/m or less. Preferred specific examples of such an organic solvent include ethanol, 1-propanol, 2-propanol (isopropyl alcohol (IPA)), 1-butanol, 1-methoxyethanol, and acetone, among which 2-propanol is more preferable. By using such a rinsing liquid containing an organic solvent, collapse of a pattern structure can be further inhibited in the case where drying is carried out after the rinsing treatment.

The surface tension is a measurement value at room temperature (23° C.), as measured using an automatic surface tensiometer CBVP-Z (manufactured by Kyowa Interface Science Co., Ltd.).

The rinsing liquid may be a rinsing liquid consisting only of such an organic solvent or may be a rinsing liquid in which an organic solvent and water are mixed.

In the case of a rinsing liquid in which an organic solvent and water are mixed, the volume ratio of organic solvent to water (organic solvent/water) is preferably 1/0.1 to 1/10 and more preferably 1/0.3 to 1/7.

[Application of Pretreatment Liquid and Rinsing Liquid]

In the treatment method of the present invention, the embodiment of applying the pretreatment liquid and the rinsing liquid (that is, the embodiment of pretreatment and rinsing treatment) is not particularly limited. For example, the embodiment of pretreatment and rinsing treatment may be a batch-wise treatment using a bath or may be a treatment using a single sheet type apparatus. Specifically, in the bath treatment, as shown in FIGS. 1A to 1D, a semiconductor substrate product including a pattern structure can be immersed and treated in a bath filled with a pretreatment liquid or a rinsing liquid. It is preferred that the single sheet type apparatus has a treatment tank, and the above-mentioned semiconductor substrate is transferred or rotated in the treatment tank, and a pretreatment liquid or rinsing liquid is applied (by ejecting, spraying, flowing down, dropwise adding, or the like) into the treatment tank so that the pretreatment liquid or rinsing liquid is brought into contact with the semiconductor substrate.

The treatment temperature of the pretreatment and the rinsing treatment is preferably 10° C. or higher and more preferably 20° C. or higher. The upper limit of the treatment temperature is preferably 80° C. or lower, more preferably 60° C. or lower, and still more preferably 40° C. or lower. The treatment temperature is based on the temperature at the time of applying to a pattern structure, but it may be the storage temperature or may be set as the temperature inside the tank in the case of a batch-wise treatment, or the temperature in the circulation flow path in the case of a circulation system. With respect to the treatment time of the pretreatment and the rinsing treatment, the immersion time is preferably 10 seconds to 30 minutes, more preferably 15 seconds to 20 minutes, still more preferably 20 seconds to 15 minutes, and particularly preferably 30 seconds to 10 minutes

[Method for Manufacturing Electronic Device]

The present invention also relates to a method for manufacturing an electronic device, which is used to manufacture an electronic device (for example, a semiconductor substrate product, or a micromachine) and which includes the above-described method for treating a pattern structure according to the present invention. That is, the pattern structure to which the pretreatment liquid of the present invention has been applied is used for an electronic device such as a semiconductor substrate product.

EXAMPLES

Hereinafter, the present invention will be described with reference to the following Examples, but the present invention is not limited thereto. The amounts and/or ratios shown in the Examples are on a mass basis unless otherwise specified.

Examples 1 to 27 and Comparative Examples 1 to 4>

A wafer with formation of a clean flat film for evaluation, which was constituted of the respective materials (Si, $SiO_2$, or SiN) described in Table 1 below, was prepared. In order to remove a natural oxide film, a pretreatment was carried out using 5% HF. A beaker test (pretreatment) was carried out using the wafer after the pretreatment. Specifically, a pretreatment liquid having the component composition shown in Table 1 below was first prepared, and the wafer was placed in the beaker while stirring the pretreatment liquid at room temperature in the beaker at 250 rpm, followed by a pretreatment for 5 minutes. The wafer after the pretreatment was rinsed with isopropyl alcohol (IPA) at 40° C. for 30 seconds and dried using $N_2$ gas. The temperature at the time of drying was 20° C. (room temperature).

With respect to the wafer after the drying, the stationary contact angle was measured using isopropyl alcohol (IPA) which is a rinsing liquid and using the following contact angle meter. This is a substitute measure of $\theta_{CA}$ described above, and as this value is larger, $\cos \theta_{CA}$ becomes smaller. As a result, it can be said that the capillary force in the pattern structure can be reduced. The results are shown in Table 1 below.

The stationary contact angle [$\theta_{CA}$] was measured at room temperature (25° C.) using DM-500 (trade name, manufactured by Kyowa Interface Science Co., Ltd.).

In addition, damage of the flat film constituted of Si was confirmed using an ellipsometer. Specifically, the thickness of the removed film was calculated by measuring the film thickness before and after the pretreatment using ellipsometry (with a spectroscopic ellipsometer VASE manufactured by J. A. Woollam Japan Co., Ltd.). An average value of 5 points was adopted (measurement condition and measurement range: 1.2-2.5 eV, measurement angle: 70, 75 degrees). The results are shown in Table 1 below.

A: Damage is 0.1 nm or less
B: Damage is more than 0.1 nm and less than 0.5 nm
C: Damage is more than 0.5 nm

TABLE 1

| | Component composition | | | | | | | | | pH | Temp. (°C.) | Stationary contact angle (°) | | | Capillary force | | | Si damage |
|---|---|---|---|---|---|---|---|---|---|---|---|---|---|---|---|---|---|---|
| | Component 1 | Conc. (%) | Component 2 | Conc. (%) | Component 3 | Conc. (%) | Component 4 | Conc. (%) | | | Si | SiO$_2$ | SiN | Si | SiO$_2$ | SiN | |
| Example 1 | NK GUARD S-750 | 0.05 | | | HCl | 0.5 | DI water | 99.45 | 1.2 | R.T | 34.5 | 31.7 | 11.1 | 13713 | 14157 | 16329 | A |
| Example 2 | NK GUARD S-750 | 0.05 | | | DGA | 0.16 | DI water | 99.79 | 11 | R.T | 33.8 | 38 | 35.7 | 13828 | 13112 | 13513 | A |
| Example 3 | NK GUARD S-0545 | 0.05 | | | HCl | 0.5 | DI water | 99.45 | 1.3 | R.T | 22.1 | 14.8 | 6.7 | 15417 | 16088 | 16526 | A |
| Example 4 | NK GUARD S-0545 | 0.05 | | | DGA | 0.16 | DI water | 99.79 | 11 | R.T | 22.6 | 21.6 | 21.8 | 15362 | 15471 | 15450 | A |
| Example 5 | SW-930 | 1 | | | HCl | 0.5 | DI water | 98.50 | 1.3 | R.T | 20.5 | 7.9 | 5.2 | 15586 | 16482 | 16572 | A |
| Example 6 | SW-930 | 1 | | | DGA | 0.18 | DI water | 98.82 | 11 | R.T | 24.5 | 5.2 | 5.5 | 15142 | 16572 | 16563 | A |
| Example 7 | SWK-601 | 1 | | | HCl | 0.5 | DI water | 98.50 | 1.4 | R.T | 31.1 | 41.7 | 21.3 | 14248 | 12424 | 15503 | A |
| Example 8 | SWK-601 | 1 | | | DGA | 0.23 | DI water | 98.77 | 11 | R.T | 32.6 | 39 | 36.7 | 14018 | 12932 | 13342 | A |
| Example 9 | Unidyne TG-8111 | 1 | | | DGA | 0.14 | DI water | 98.86 | 1.5 | R.T | 22 | 3.4 | 21.4 | 15428 | 16611 | 15493 | A |
| Example 10 | ASAHI GUARD AG-E060 | 0.5 | | | | | DI water | 99.50 | 4.2 | R.T | 43.4 | 43.6 | 35.8 | 12090 | 12050 | 13496 | A |
| Example 11 | ASAHI GUARD AG-E060 | 0.5 | | | HCl | 0.5 | DI water | 99.00 | 1.4 | R.T | 44.6 | 47.6 | 48.6 | 11848 | 11220 | 11004 | A |
| Example 12 | ASAHI GUARD AG-E070 | 1 | | | HCl | 0.5 | DI water | 98.50 | 1.3 | R.T | 47.2 | 50.1 | 49.2 | 11306 | 10674 | 10873 | A |
| Example 13 | ASAHI GUARD AG-E080 | 1 | | | HCl | 0.5 | DI water | 98.50 | 1.5 | R.T | 19.4 | 29.6 | 27.7 | 15695 | 14468 | 14733 | A |
| Example 14 | ASAHI GUARD AG-E100 | 1 | | | HCl | 0.5 | DI water | 98.50 | 1.6 | R.T | 40.1 | 40.5 | 39.2 | 12728 | 12653 | 12895 | A |
| Example 15 | ASAHI GUARD AG-E100 | 1 | | | MEA | 0.4 | DI water | 98.60 | 10 | R.T | 37.4 | 39.2 | 38.4 | 13219 | 12895 | 13041 | A |
| Example 16 | ASAHI GUARD AG-E100 | 0.5 | Phosphoric acid | 0.5 | DGA | 0.44 | DI water | 98.56 | 4 | R.T | 43 | 40.6 | 36 | 12170 | 12634 | 13462 | A |
| Example 17 | ASAHI GUARD AG-E100 | 0.5 | Phosphoric acid | 0.5 | MEA | 0.47 | DI water | 98.53 | 5 | R.T | 47.2 | 43.3 | 39.3 | 12288 | 12110 | 14733 | A |
| Example 18 | ASAHI GUARD AG-E100 | 0.5 | Phosphoric acid | 0.5 | DGA | 0.91 | DI water | 98.09 | 8 | R.T | 33.8 | 13.5 | 12.2 | 13828 | 16180 | 12895 | A |
| Example 19 | ASAHI GUARD AG-E100 | 0.5 | | | DMEA | 0.24 | DI water | 99.26 | 11 | R.T | 34.2 | 27.8 | 29.8 | 13763 | 14719 | 13041 | A |
| Example 20 | ASAHI GUARD AG-E100 | 0.5 | Acetic acid | 0.05 | DGA | 0.59 | DI water | 98.86 | 5 | R.T | 40.4 | 37.4 | 32.8 | 12672 | 13219 | 13462 | A |
| Example 21 | ASAHI GUARD AG-E100 | 0.5 | Citric acid | 0.05 | DGA | 0.51 | DI water | 98.94 | 5.1 | R.T | 38.7 | 24.3 | 25.6 | 12986 | 15166 | 15006 | A |
| Example 22 | ASAHI GUARD AG-E100 | 0.5 | Malic acid | 0.05 | DGA | 0.52 | DI water | 98.93 | 5.1 | R.T | 38.7 | 28.8 | 27.9 | 12986 | 14582 | 14706 | A |
| Example 23 | ASAHI GUARD AG-E060 | 0.5 | Phosphoric acid | 0.5 | DGA | 0.53 | DI water | 98.47 | 6.1 | R.T | 42.8 | 47.5 | 46.5 | 12209 | 11242 | 11454 | A |
| Example 24 | ASAHI GUARD AG-E060 | 0.5 | Phosphoric acid | 0.5 | MEA | 0.96 | DI water | 98.04 | 8.1 | R.T | 52 | 31.4 | 31.8 | 10245 | 14203 | 14142 | A |
| Example 25 | ASAHI GUARD AG-E060 | 0.5 | | | DGA | 2.22 | DI water | 97.28 | 12 | R.T | 42.8 | 47.6 | 32.8 | 12209 | 11220 | 13462 | C |
| Example 26 | ASAHI GUARD AG-E100 | 0.1 | ASAHI GUARD AG-E060 | 0.1 | DMEA | 0.24 | DI water | 99.56 | 11 | R.T | 34.2 | 39.2 | 32.8 | 13763 | 12895 | 13462 | A |
| Example 27 | ASAHI GUARD AG-E070 | 0.5 | IPA | 30 | DGA | 0.23 | DI water | 69.27 | 11 | R.T | 47.2 | 43.4 | 36.7 | 11306 | 12090 | 13342 | A |
| Comparative Example 1 | Non-treated: the contact angle of a non-treated substrate was measured using pure water | | | | | | | | | | 54 | 6 | 11 | 34010 | 57661 | 56973 | A |
| Comparative | Non-treated: the contact angle of a non-treated substrate was measured using IPA | | | | | | | | | | 3 | 5 | 3 | 16617 | 16577 | 16617 | A |

TABLE 1-continued

| | Component composition | | | | | | | | | Stationary contact angle (°) | | | Capillary force | | | Si damage |
|---|---|---|---|---|---|---|---|---|---|---|---|---|---|---|---|---|
| | Component 1 | Conc. (%) | Component 2 | Conc. (%) | Component 3 | Conc. (%) | Component 4 | Conc. (%) | pH | Temp. (°C.) | Si | SiO$_2$ | SiN | Si | SiO$_2$ | SiN | |
| Example 2 Comparative Example 3 | SURFLON S-221 | 0.05 | | | | | DI water | 99.95 | 5.9 | R.T | 5 | 5 | 3 | 16577 | 16577 | 16617 | A |
| Comparative Example 4 | Polyvinylpyrrolidone | 0.05 | | | DGA | 0.14 | DI water | 99.81 | 11 | R.T | 3 | 3 | 3 | 16617 | 16617 | 16617 | A |

<Notes of Table 1>
Conc.: Concentration (mass %)
R.T.: Room temperature (about 25° C.)
SURFLON S-221: perfluoroalkylrialkylammonium halide, manufactured by AGC Seimi Chemical Co., Ltd.
Polyvinylpyrrolidone: K-30, manufactured by Nippon Shokubai Co., Ltd.
For each Example, the above-mentioned commercially available fluorine-based polymer having a repeating unit containing a fluorine atom was used as Component 1 in Table 1.
HCl: hydrochloric acid
DGA: diglycol amine
MEA: 2-aminoethanol
DMEA: N,N-dimethyl-2-aminoethanol
DI water: distilled water The assumptions for calculating Capillary force in Table 1 are as follows.

γ: 72.5 mN/m
D: 20 nm
S: 20 nm
$θ_{CA}$: measurement value (°)
$θ_r$: 0°
H: 400 nm As is apparent from the results shown in Table 1, it was found that the value of capillary force was smaller in Examples 1 to 27 as compared with Comparative Examples 1 to 4, and collapse of the pattern structure could be inhibited in Examples 1 to 27.

At this time, it was found that the value of capillary force tended to be smaller in the Examples using a cationic fluorine-based polymer as Component 1.

For example, the capillary force of Si was smaller in Examples 1 and 2, 10 to 12 and 14 to 25 in which the fluorine-based polymer is cationic, than in Examples 3 to 9 and 13 in which the fluorine-based polymer is not cationic.

More specifically, for example, when comparing Examples 1 and 3, the value of capillary force was smaller in Example 1 in which the fluorine-based polymer is cationic, than in Example 3 in which the fluorine-based polymer is non-ionic (the same also applies to the comparison between Examples 2 and 4).

Incidentally, damage to a flat film was reduced in Examples 1 to 24 and 26 and 27 in which the pH of the pretreatment liquid was 11 or less, as compared with Example 25 in which the pH of the pretreatment liquid was 12.

Further, with respect to the pretreatment liquid to which a buffer was added, the pH of the pretreatment liquid did not fluctuate even after being left to stand at room temperature for 24 hours, and the storage stability of the pretreatment liquid was excellent.

Examples 2-2 and 2-3, Examples 10-2 and 10-3, Example 20-2, Example 21-2, Example 22-2, and Example 28

The evaluation was carried out in the same manner as in Examples 1 to 27 shown in Table 1, except that the conditions of the rinsing treatment were changed. Specifically, a pretreatment liquid having the component composition shown in Table 2 below was first prepared, and a wafer was placed in a beaker while stirring the pretreatment liquid at room temperature in the beaker at 250 rpm, followed by a pretreatment for 5 minutes. The wafer after the pretreatment was rinsed with a rinsing liquid shown in Table 2 below at 23° C. for 30 seconds and dried using $N_2$ gas. The temperature at the time of drying was 20° C. (room temperature).

With respect to the wafer after the drying, the stationary contact angle was measured using a rinsing liquid shown in Table 2 below, and the value of capillary force was obtained therefrom. The results are shown in Table 2 below.

TABLE 2

| | Component composition | | | | | | | | |
|---|---|---|---|---|---|---|---|---|---|
| | Component 1 | Conc. (%) | Component 2 | Conc. (%) | Component 3 | Conc. (%) | Component 4 | Conc. (%) | Component 5 | Conc. (%) |
| Example 2-2 | NK GUARD S-750 | 0.05 | | | DGA | 0.16 | | | DI water | 99.79 |
| Example 2-3 | | | | | | | | | | |
| Example 10-2 | ASAHI GUARD AG-E060 | 0.5 | | | | | | | DI water | 99.5 |
| Example 10-3 | | | | | | | | | | |
| Example 20-2 | ASAHI GUARD AG-E100 | 0.05 | Acetic acid | 0.5 | DGA | 0.59 | | | DI water | 98.86 |
| Example 21-2 | ASAHI GUARD AG-E100 | 0.05 | Citric acid | 0.5 | MEA | 0.51 | | | DI water | 98.94 |
| Example 22-2 | ASAHI GUARD AG-E100 | 0.05 | Malic acid | 0.5 | DGA | 0.52 | | | DI water | 98.93 |
| Example 28 | ASAHI GUARD AG-E100 | 0.5 | Acetic acid | 0.5 | DGA | 0.61 | IPA | 20 | DI water | 78.39 |

| | | | Rinsing liquid IPA:DI water volume mixing ratio | Stationary contact angle (°) | | | Capillary force | | |
|---|---|---|---|---|---|---|---|---|---|
| | pH | Temp. (° C.) | | Si | $SiO_2$ | SiN | Si | $SiO_2$ | SiN |
| Example 2-2 | 11 | R.T | 1:3 | 74 | 79.3 | 74.5 | 5733 | 3520 | 4703 |
| Example 2-3 | | | 1:1 | 43 | 50.3 | 46.4 | 15212 | 12111 | 12137 |
| Example 10-2 | 4.2 | R.T | 2:1 | 61.7 | 57.5 | 54.1 | 8344 | 9456 | 10320 |
| Example 10-3 | | | 1:2 | 58.2 | 58.4 | 59.8 | 10539 | 10480 | 10060 |
| Example 20-2 | 5 | R.T | 1:4 | 87.7 | 57.7 | 68.1 | 899 | 11969 | 8355 |
| Example 21-2 | 5.1 | R.T | 1:4 | 88.9 | 84.8 | 96.1 | 430 | 2030 | −2380 |
| Example 22-2 | 5.1 | R.T | 1:4 | 87.2 | 84.9 | 80.9 | 1094 | 1991 | 3543 |
| Example 28 | 4.8 | R.T | 1:4 | 93 | 77.5 | 74.4 | −1172 | 4848 | 6024 |

From the results shown in Table 2, it was also found that the value of capillary force was small in each Example, and collapse of the pattern structure could be inhibited.

EXPLANATION OF REFERENCES

1: columnar structure portion
2: substrate
3: pretreatment liquid (treatment liquid, treatment liquid for inhibiting collapse of pattern structure)
4: rinsing liquid
9: separation portion
10/ pattern structure
100: semiconductor substrate product
h: height of columnar structure portion
w1: separation width of separation portion
w2: member width of columnar structure portion

What is claimed is:

1. A method for treating a pattern structure, comprising:
applying a treatment liquid containing a fluorine-based polymer having a repeating unit containing a fluorine atom to the pattern structure formed of an inorganic material, wherein the fluorine-based polymer includes a fluoroalkyl (meth)acrylate polymer, and the fluoroalkyl (meth)acrylate polymer has a repeating unit derived from a polymerizable compound having a cationic group.

2. The method for treating a pattern structure according to claim 1, wherein the treatment liquid includes water.

3. The method for treating a pattern structure according to claim 1, wherein the pattern structure includes at least one selected from the group consisting of Si, $SiO_2$, SiN, Ge, and SiGe.

4. The method for treating a pattern structure according to claim 1, wherein the pattern structure includes all of Si, $SiO_2$, and SiN.

5. The method for treating a pattern structure according to claim 1, wherein the treatment liquid has a pH of 11 or less.

6. The method for treating a pattern structure according to claim 1, wherein the treatment liquid has a pH of 4 or more and 11 or less.

7. The method for treating a pattern structure according to claim 1, wherein the treatment liquid further contains a buffer.

8. The method for treating a pattern structure according to claim 1, wherein a rinsing liquid containing an organic solvent is applied to the pattern structure to which the treatment liquid has been applied.

9. A method for manufacturing an electronic device, comprising:
the method for treating a pattern structure according to claim 1.

10. A treatment liquid for inhibiting collapse of a pattern structure, comprising:
a fluorine-based polymer having a repeating unit containing a fluorine atom, wherein the treatment liquid is applied to the pattern structure formed of an inorganic material, the fluorine-based polymer includes a fluoroalkyl (meth)acrylate polymer and the fluorine-based polymer has a repeating unit derived from a polymerizable compound having a cationic group.

11. The treatment liquid for inhibiting collapse of a pattern structure according to claim 10, further comprising: water.

12. The treatment liquid for inhibiting collapse of a pattern structure according to claim 10, wherein the pattern structure includes at least one selected from the group consisting of Si, $SiO_2$, SiN, Ge, and SiGe.

13. The treatment liquid for inhibiting collapse of a pattern structure according to claim 10, wherein the pattern structure includes all of Si, $SiO_2$, and SiN.

14. The treatment liquid for inhibiting collapse of a pattern structure according to claim 10, wherein the treatment liquid has a pH of 11 or less.

15. The treatment liquid for inhibiting collapse of a pattern structure according to claim 10, wherein the treatment liquid has a pH of 4 or more and 11 or less.

16. The treatment liquid for inhibiting collapse of a pattern structure according to claim 10, further comprising: a buffer.

17. A treatment liquid for inhibiting collapse of a pattern structure, comprising:
a fluorine-based polymer having a repeating unit containing a fluorine atom, wherein the treatment liquid is applied to the pattern structure formed of an inorganic material, and
wherein the treatment liquid contains an alkanol having a surface tension of 30 mN/m or less, the fluorine-based polymer includes a fluoroalkyl (meth)acrylate polymer, and the fluoroalkyl (meth)acrylate polymer has a repeating unit derived from a polymerizable compound having a cationic group.

18. The treatment liquid for inhibiting collapse of a pattern structure according to claim 17, further comprising: water.

19. The treatment liquid for inhibiting collapse of a pattern structure according to claim 17, wherein the pattern structure includes at least one selected from the group consisting of Si, $SiO_2$, SiN, Ge, and SiGe.

20. The treatment liquid for inhibiting collapse of a pattern structure according to claim 17 wherein the pattern structure includes all of Si, $SiO_2$, and SiN.

21. The treatment liquid for inhibiting collapse of a pattern structure according to claim 17, wherein the treatment liquid has a pH of 11 or less.

22. The treatment liquid for inhibiting collapse of a pattern structure according to claim 17, wherein the treatment liquid has a pH of 4 or more and 11 or less.

23. The treatment liquid for inhibiting collapse of a pattern structure according to claim 17, further comprising: a buffer.

24. The treatment liquid for inhibiting collapse of a pattern structure according to claim 17, wherein the alkanol is 2-propanol.

25. The treatment liquid for inhibiting collapse of a pattern structure according to claim 17, wherein the content of the alkanol is 0.1 to 80 mass % in the treatment liquid.

* * * * *